United States Patent
Nakajima

(10) Patent No.: US 10,104,780 B2
(45) Date of Patent: Oct. 16, 2018

(54) FLEXIBLE PRINTED CIRCUIT BOARD AND METHOD OF PRODUCING FLEXIBLE PRINTED CIRCUIT BOARD

(71) Applicant: Toshiaki Nakajima, Tokyo (JP)

(72) Inventor: Toshiaki Nakajima, Tokyo (JP)

(73) Assignee: RICOH COMPANY, LTD., Tokyo (JP)

(*) Notice: Subject to any disclaimer, the term of this patent is extended or adjusted under 35 U.S.C. 154(b) by 0 days.

(21) Appl. No.: 15/151,584

(22) Filed: May 11, 2016

(65) Prior Publication Data

US 2016/0345426 A1 Nov. 24, 2016

(30) Foreign Application Priority Data

May 19, 2015 (JP) .................. 2015-101810

(51) Int. Cl.
*H05K 1/00* (2006.01)
*H05K 3/00* (2006.01)
*H05K 1/18* (2006.01)
*H05K 3/28* (2006.01)

(52) U.S. Cl.
CPC ........... *H05K 3/0014* (2013.01); *H05K 1/189* (2013.01); *H05K 3/285* (2013.01); *H05K 3/284* (2013.01); *H05K 2201/0141* (2013.01); *H05K 2201/0154* (2013.01); *H05K 2203/0139* (2013.01); *H05K 2203/0759* (2013.01); *H05K 2203/107* (2013.01); *H05K 2203/1316* (2013.01); *H05K 2203/1327* (2013.01)

(58) Field of Classification Search
USPC ......................................................... 361/749
See application file for complete search history.

(56) References Cited

U.S. PATENT DOCUMENTS

| 2006/0103030 A1* | 5/2006 | Aoki | .................... G11B 25/043 257/778 |
| 2008/0074098 A1* | 3/2008 | Vranish | .................... G01D 5/24 324/76.11 |

FOREIGN PATENT DOCUMENTS

| JP | 4-262590 | 9/1992 |
| JP | 7-162137 | 6/1995 |
| JP | 2012-195538 | 10/2012 |
| JP | 2014-075512 | 4/2014 |

* cited by examiner

Primary Examiner — Andargie M Aychillhum
(74) Attorney, Agent, or Firm — Cooper & Dunham LLP

(57) ABSTRACT

A flexible printed circuit board includes a thin film electrical insulation substrate made of heat-curable resin having heat resistance and electrical insulation properties, an electrically conductive pattern composed of an electric conductor formed on the thin film electrical insulation substrate in a prescribed shape, and a thin film cover lay made of heat-curable resin placed and cured on the thin film electrical insulation substrate to cover the electrically conductive pattern.

13 Claims, 4 Drawing Sheets

FLEXIBLE PRINTED CIRCUIT BOARD AND METHOD OF PRODUCING FLEXIBLE PRINTED CIRCUIT BOARD

CROSS-REFERENCE TO RELATED APPLICATION

This patent application is based on and claims priority pursuant to 35 U.S.C. § 119(a) to Japanese Patent Application No. 2015-101810 filed on May 19, 2015 in the Japan Patent Office, the entire disclosure of which is hereby incorporated by reference herein.

BACKGROUND

Technical Field

Embodiments of the present invention relate to printed circuit boards, and in particular to flexible printed circuit boards having electrical insulation and heat resistance properties and used in an electronic device.

Related Art

In recent years, due to its ability to place various electronic circuits and sensors or the like in narrow spaces created between various electronic parts accommodated in an electric system, flexible printed circuit boards are becoming increasingly more common. Further, as electronic devices become more compact, demand for ever-thinner flexible printed circuit boards grows accordingly.

FIGS. 6 and 7 illustrate a structure and a method of producing a conventional flexible printed circuit board 200, respectively. The conventional flexible printed circuit board 200 is generally constituted as a substrate 10 made of plastic, such as polyimide, liquid crystal polymer, etc., a prescribed electrically conductive pattern 20 formed on the substrate 10, and an electrical insulator (i.e., a cover lay) 40 also made of plastic and bonded to the electrically conductive pattern 20 and the substrate 10 as well.

SUMMARY

One aspect of the present invention provides a novel flexible printed circuit board that includes a thin film electrical insulation substrate made of heat-curable resin having heat resistance and electrical insulation properties, an electrically conductive pattern composed of an electric conductor formed on the thin film electrical insulation substrate in a prescribed shape, and a thin film cover lay made of heat-curable resin placed and cured on the thin film electrical insulation substrate to cover the electrically conductive pattern.

Another aspect of the present invention provides a novel method of producing a flexible printed circuit board. The method includes the steps of producing an thin film electrical insulation substrate in a given shape with heat-curable resin having heat resistance and electrical insulation properties in an thin film electrical insulation substrate production step, foaming an electrically conductive pattern with an electric conductor on the thin film electrical insulation substrate in a prescribed shape in an electrically conductive pattern forming step, and placing and curing a thin film cover lay made of heat-curable resin on the thin film electrical insulation substrate while almost covering the electrically conductive pattern in a thin film cover lay curing process.

BRIEF DESCRIPTION OF THE DRAWINGS

A more complete appreciation of the present idsclosure and many of the attendant advantages thereof will be more readily obtained as substantially the same becomes better understood by reference to the following detailed description when considered in connection with the accompanying drawings, wherein.

DETAILED DESCRIPTION

Figure 6:
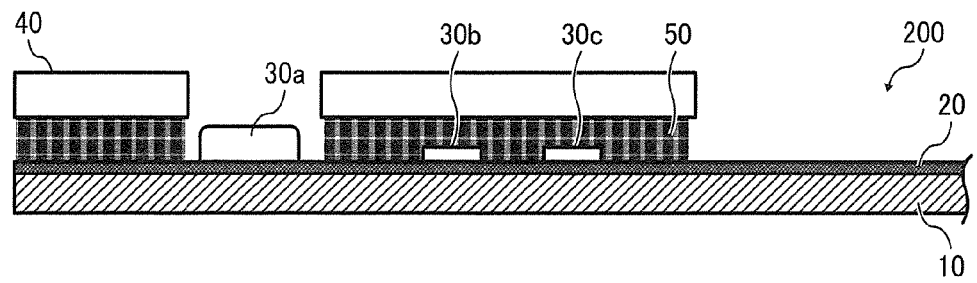
FIG. 6 is a cross-sectional view schematically illustrating a structure of a conventional flexible printed circuit board.

In general, as briefly described above, the conventional flexible printed circuit board 200 is produced by forming the given electrically conductive pattern 20 on the substrate 10 made of plastic, such as polyimide, liquid crystal, etc., and bonding the electrical insulator (e.g., the cover lay) 40 also made of plastic onto the given electrically conductive pattern 20 and the substrate 10 as well as shown in FIG. 6.

The substrate 10 of the conventional flexible printed circuit board 200 is generally prepared in a state of a roll film with a uniform film thickness of from about 25 μm to about 75 μm. The electrically conductive pattern 20 made of a copper foil or the like is then formed on the roll film of the substrate 10. The cover lay 40 is then bonded onto the roll film and the electrically conductive pattern 20. An adhesive in a layer state (i.e., an adhesive layer 50) having a film thickness of about 12 μm is used to bond the cover lay 40 onto the roll film of the substrate and the electrically conductive pattern 20 as well, thereby constituting the flexible printed circuit board together with the cover lay 40, the roll film of the substrate, and the electrically conductive pattern 20.

In the conventional flexible printed circuit board 200, electrical insulation of the electrically conductive pattern 20 and flexibility of the flexible printed circuit board 200 are ensured at the same time by partially changing a film thickness of the electrically conductive pattern 20.

The flexibility of the flexible printed circuit board generally increases as films of the substrate 10 and the cover lay 40 are thinned. However, the adhesive layer 50 generally resists the flexibility of the flexible printed circuit board 200. Further, when it is excessively thinned, the cover lay 40 is hardly adhered to the substrate 10 in an adhesion process thereof. That is, handling of the cover lay 40 in the adhesion process is difficult. Accordingly, there is a given limit to thinning the films of the substrate 10, the cover lay 40, and the adhesive layer 50 as well.

Figure 7:
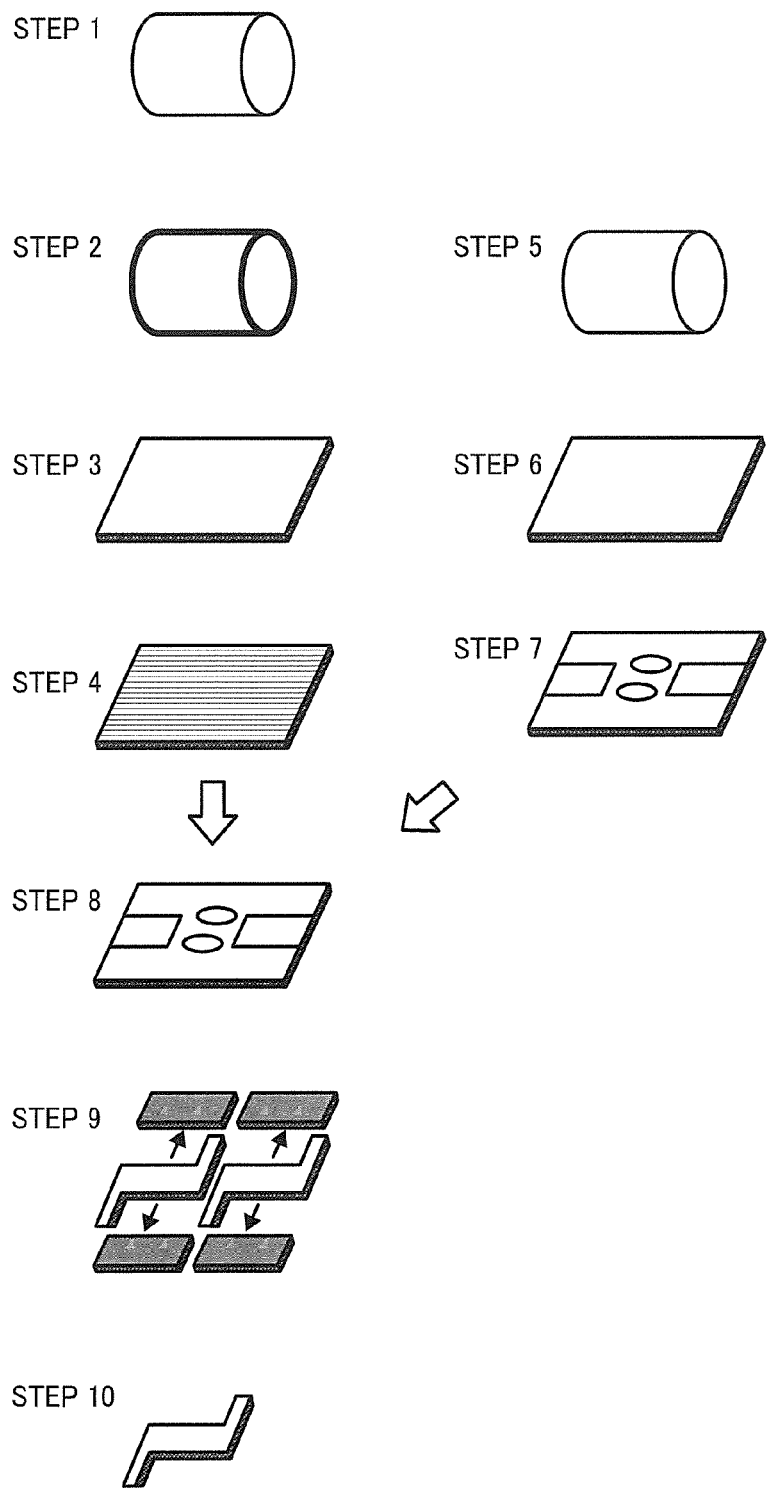
FIG. 7 is a perspective view schematically illustrating again a method of producing the conventional flexible printed circuit board of FIG. 6.

FIG. 7 illustrates a conventional method of producing the flexible printed circuit board. As shown, the conventional flexible printed circuit board is generally produced by below described multiple steps. That is, an electrical insulation substrate is initially produced in step 1. A copper foil is then pasted onto the electrical insulation substrate in step 2. The electrical insulation substrate is then cut into a rectangular shape in step 3. A circuit pattern is then formed on the electrical insulation substrate by using photolithography in step 4. Meanwhile, a roll film of a cover lay is separately produced in step 5. The cover lay is then cut into a rectangular shape in step 6. A prescribed portion is then cut out from the cover lay in step 7 as shown there. After cutting the prescribed portion out, the cover lay is laminated onto the electrical insulation substrate in step 8. The electrical insulation substrate with all of the copper foil, the circuit pattern, and the cover lay excluding the prescribed portion thereon is trimmed to obtain the flexible printed circuit board having a prescribed shape in steps 9 and 10. However, since the above-described various steps necessitate an expensive and bulky system and/or manual work, the cost for producing the flexible printed circuit board is accordingly raised.

When the cover lay is made of polyimide and a breakdown (or withstand) voltage of about 500 V is required as electrical insulation therefor, for example, the cover lay of the polyimide needs to have a film thickness of about 2 μm. However, in view of workability in the step of laminating the cover lay onto the electrical insulation substrate, a film thickness of the cover lay is hardly decreased to be less than about 12.5 μm, practically.

Since the flexible printed circuit board is located in a space between the electronic parts, it frequently needs to be almost formed in the shape of either a letter L or a letter S and the like. Accordingly, the flexible printed circuit board having a rectangular shape is trimmed to have such a target shape. As a result, waste material (i.e., four sheets of hatched portions in step 9 of FIG. 7) is necessarily generated as garbage when the flexible printed circuit board is trimmed as described above, thereby raising the cost of the flexible printed circuit board.

Hence, the present disclosure describes a novel flexible printed circuit board without raising the cost for producing the same, and a novel method of producing such a flexible printed circuit board.

That is, according to one embodiment of the present invention, the conventionally employed steps of producing the roll film of the substrate and laminating the cover lay onto the electrical insulation substrate are omitted, and a new flexible printed circuit board can consistently include electrical insulation, heat resistance, and flexibility at the same time by changing film thicknesses of the electrical insulation substrate and the cover lay in prescribed portions thereof while keeping least film thicknesses required therefor, respectively.

In short, the flexible printed circuit board of one embodiment of the present invention is configured by an electrical insulation substrate, an electrically conductive pattern, and a cover lay while excluding an adhesive layer conventionally disposed between the electrical insulation substrate and the cover lay.

Figure 1:
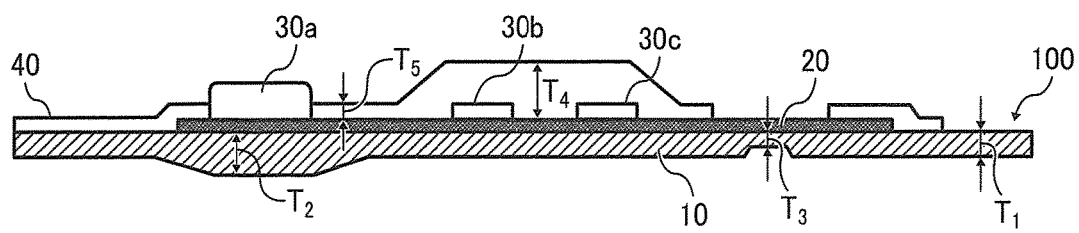
FIG. 1 is a cross-sectional view schematically illustrating an exemplary configuration of a flexible printed circuit board according to one embodiment of the present invention.

Referring now to the drawings, wherein like reference numerals designate identical or corresponding parts throughout the several views thereof, and in particular to FIG. 1, an exemplary structure of a flexible printed circuit board 100 according to one embodiment of the present invention is specifically described, initially. That is, FIG. 1 illustrates a general configuration of the flexible printed circuit board 100. As shown there, the flexible printed circuit board 100 includes an electrical insulation substrate 10, an electrically conductive pattern 20, multiple elements 30a, 30b, and 30c (i.e., electronic components), and a cover lay 40.

The electrical insulation substrate 10 is a thin film made of heat-curable resin having electrical insulation, such as polyimide, liquid crystal polymer, etc. The electrical insulation substrate 10 has a different film thickness depending on a region thereof (i.e., depending on presence or absence of the multiple elements or the like). That is, as shown in FIG. 1, to provide sufficient flexibility and necessary heat resistance to the flexible printed circuit board 100 at the same time, the film thickness of the most part T1 of the electrical insulation substrate 10 is about 25 μm and that of the other portion T2 is about 75 μm because the heat resistance is especially required there, for example. At the same time, the film thickness of the other portion T3 is about 12 μm because the flexibility is especially required there, for example.

Figure 2A:
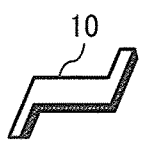
FIGS. 2A, 2B, 2C, and 2D are diagrams collectively illustrating an exemplary whole process of producing the flexible printed circuit board according to one embodiment of the present invention.
Figure 2B:
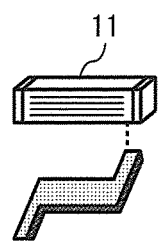

The electrically conductive pattern 20 is a conductor of electricity (hereinafter referred to as an electric conductor) placed on the electrical insulation substrate 10. The electrically conductive pattern 20 may be formed by using an ink-jet printing system (i.e., an ink-jet printing machine 11 using conductive ink, for example, as shown in FIG. 2B). That is, the electrical insulation substrate 10 is coated with the conductive ink to form a circuit thereon, for example. Otherwise, as conventionally employed, the electrically conductive pattern 20 can be formed by using either a screen printing system or an etching system that provides an etching process to an electrically conductive film as well.

The above-described elements 30a, 30b, and 30c are electronic components such as connectors, semiconductor devices, chip parts, etc., connected to the electrically conductive pattern 20. In this embodiment of the present invention, the element 30a is the connector, for example. Because it is required to connect to an external parts located outside the flexible printed circuit board 100, the element 30a of the connector is not covered by the cover lay 40 (i.e., exposed to an outside). By contrast, because these parts do not need to connect to the external parts and need to be electrically insulated therefrom, the elements 30b and 30c (e.g., semiconductor devices, chip parts, etc.,) are covered by the cover lay 40. Here, portions T4 of the cover lay 40 covering the elements 30b and 30c are thicker than the other portion of the cover lay 40 as herein below described with reference to FIG. 1.

That is, the cover lay 40 is a thin film made of heat-curable resin, such as polyimide, liquid crystal polymer, etc., having electrical insulation as the electrical insulation substrate 10. The cover lay 40 again has a different film thickness depending on a region thereof (i.e., depending on presence or absence of the multiple elements or the like). That is, the majority portion T5 of the cover lay 40 has a film thickness of about 2 μm. Whereas the other portion T4 of the cover lay 40 needed to have either heat resistance or particularly high electrical insulation is made thicker than the majority portion thereof to have a film thickness of about 12 μm, for example. Specifically, in this embodiment of the present invention, the portion of the cover lay 40 covering the elements 30b and 30c required to have heat resistance is relatively thickened to ensure a prescribed level of heat resistance as needed. Here, the cover lay 40 directly contacts the electrical insulation substrate 10, the electrically conductive pattern 20, and the elements 30b and 30c while omitting adhesive generally needed to bond these members therebetween.

Figure 2C:
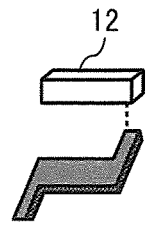
Figure 2D:
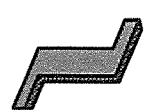

Now, an exemplary method of producing the flexible printed circuit board 100 according to another embodiment of the present invention is described with reference to FIGS. 2A, 2B, 2C, and 2D and applicable drawings. FIGS. 2A, 2B, 2C, and 2D collectively illustrate an entire process of producing the flexible printed circuit board 100, briefly. That is, to obtain the flexible printed circuit board 100 as shown in FIG. 2D the method includes a process of producing the electrical insulation substrate 10 as a first step as shown in FIG. 2A, a process of producing the electrically conductive pattern 20 as a second step as shown in FIG. 2B, and a process of producing the cover lay 40 as a third step as shown in FIG. 2C. With these multiple steps, the flexible printed circuit board 100 can be ultimately obtained.

Now, the above-described multiple steps are herein below described one by one in greater detail. Initially, the first step, in which the electrical insulation substrate 10 of FIG. 2A is produced, is described. That is, for example, nonelectrically conductive heat-curable resin (i.e., a nonconductive body), such as polyimide, liquid crystal polymer, etc., is prepared and is molded into a given shape required for the flexible printed circuit board 100 by executing the below described multiple sub-steps.

First, heat-curable resin in a varnish state (herein below sometimes referred to as varnish 5) is coated onto either an inner wall of a mold 13 or a metal plate 16 (see FIGS. 3A, 3B, and 3C). The mold 13 may have a given shape to mold the electrical insulation substrate 10 having the different film thickness depending on the region thereof. With this, the electrical insulation substrate 10 as a molding can have the different film thickness in the prescribed one or more portions thereof.

At the same time, the mold 13 may be shaped to mold the electrical insulation substrate 10 having a slant between neighboring portions having different film thicknesses from each other as shown in FIG. 1. That is, these neighboring portions of the electrical insulation substrate 10 having different film thicknesses from each other can be connected by the slant.

Now, various exemplary methods of coating either the inner wall of the mold 13 or the metal plate 16 with the heat-curable resin (i.e., the varnish 5) to produce a film like electrical insulation substrate (herein below referred to as a thin film electrical insulation substrate) 10 are herein below described with reference to FIGS. 3A, 3B, and 3C.

Figure 3A:
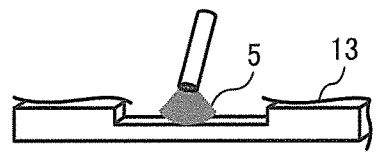
FIGS. 3A, 3B, and 3C are diagrams illustrating various exemplary methods of coating either a mold or a metal plate with heat-curable resin serving later as a substrate of the flexible printed circuit board according to one embodiment of the present invention.
Figure 3B:
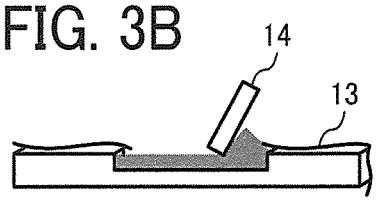

First, FIG. 3A illustrates a method of producing the thin film electrical insulation substrate 10, in which a certain amount of varnish 5 required to produce the electrical insulation substrate 10 is supplied to the mold 13. FIG. 3B illustrates a method of eliminating an unnecessary amount of varnish 5 by leveling off the certain amount of varnish 5 brought in close contact with the mold 13 as shown in FIG. 3A by using a spatula 14 made of either resin or metal as a squeegee.

Figure 3C:
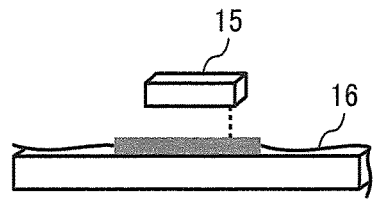

FIG. 3C illustrates another method of producing the thin film electrical insulation substrate 10, in which varnish 5 is printed onto the metal plate 16 to form a prescribed shape as required therefor by using an ink-jet printing machine 15, for example.

Specifically, a thickness of the thin film electrical insulation substrate 10 is changed depending on a region thereof by changing a total amount of heat-curable resin emitted from the ink-jet printing machine 15 onto a corresponding region in the metal plate 16. The total amount of heat-curable resin emitted from the ink-jet printing machine 15 may be changed by changing the number of emitting times of the heat-curable resin from the ink-jet printing machine 15 onto the corresponding region of the metal plate 16, for example.

Further, neighboring portions of the electrical insulation substrate 10 having different film thicknesses from each other can be connected by a slant again. The slant may be formed by gradually changing a printing condition of the ink-jet printing machine 15 in a region of the metal plate 16 corresponding to the slant, for example.

In any situation, the varnish 5 coated onto either the inner wall of the mold 13 or the metal plate 16 is then fired at a given degree of temperature for a prescribed time period. Since it is made of the above-described heat-curable resin, the varnish 5 is cured and is formed into a desired shape when reaching the given degree of temperature during such firing operation.

Now, an exemplary method of firing the heat-curable resin (e.g., the varnish 5) coated onto either the inner wall of the mold 13 or the metal plate 16 to produce the electrical insulation substrate 10 is described with reference to FIGS. 4A, 4B, 4C, and 4D and applicable drawings. That is, FIGS. 4A, 4B, 4C, and 4D are diagrams schematically illustrating various methods of firing the heat-curable resin (e.g., the varnish 5) coated onto either the inner wall of the mold 13 or the metal plate 16, respectively.

Figure 4A:
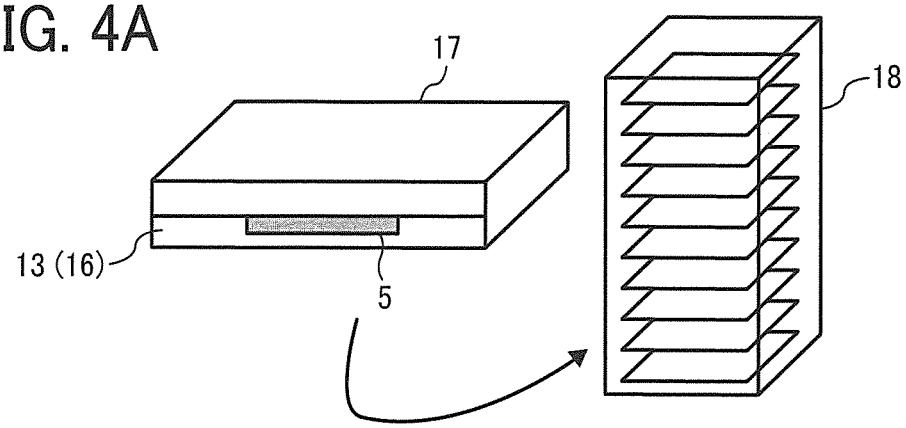
FIG. 4A is a perspective view illustrating an exemplary method of firing the heat-curable resin coated onto either the inner wall of the mold or the metal plate of FIGS. 3A, 3B, and 3C according to one embodiment of the present invention.

As shown in FIG. 4A, a batch production firing system employing a batch production firing kiln 18 is schematically illustrated therein. That is, either the mold 13 or the metal plate 16 bearing the varnish 5 thereon is covered with a heating plate 17. Then, multiple sets (e.g., ten sets) of these heating plates 17 and either the molds 13 or the metal plates 16 bearing the varnishes 5 are piled up, for example, ten times one by one. These ten sets of the heating plates 17 and either the metal plates 16 or the molds bearing the varnishes 5 are put into the batch production firing kiln 18 and are fired and heated therein at once. Hence, when ten shapes (i.e., ten molded articles of the heat-curable resin (e.g., the varnishes 5)) are formed on one piece of either the mold 13 or the metal plate 16, one hundred electrical insulation substrates 10 can be produced at once per firing, for example.

Figure 4B:
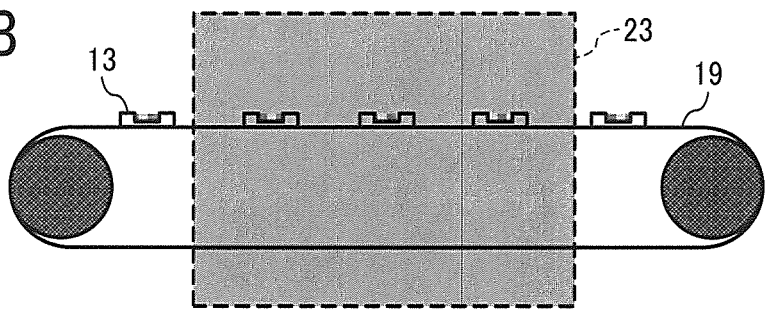
FIGS. 4B, 4C, and 4D are cross-sectional views also illustrating the other types of exemplary methods of firing the heat-curable resin coated onto either the inner wall of the mold or the metal plate of FIGS. 3A, 3B, and 3C according to one embodiment of the present invention.

As an alternative of the batch production firing system of FIG. 4A, FIG. 4B schematically illustrates a continuous electrical insulation substrate production system employing sequential production firing kiln 23. As shown there, either the molds 13 or the metal plates 16 with the heat-curable resins (e.g., the varnishes 5) thereon are placed on a belt conveyor 19 and are conveyed downstream by the belt conveyor 19. The sequential production firing kiln 23 is disposed along a path of the belt conveyor 19 to heat and fire the heat-curable resins (e.g., the varnishes 5) placed on the belt conveyor 19. Hence, the heat-curable resins (i.e., the varnishes 5) are heated and fired when either the molds 13 or the metal plates 16 passes through the sequential production firing kiln 23. Since the firing operation is continuously executed while driving the belt conveyor 19, efficiency of producing the electrical insulation substrates 10 can be improved more than in the above-described batch production firing system of FIG. 4A.

Figure 4C:
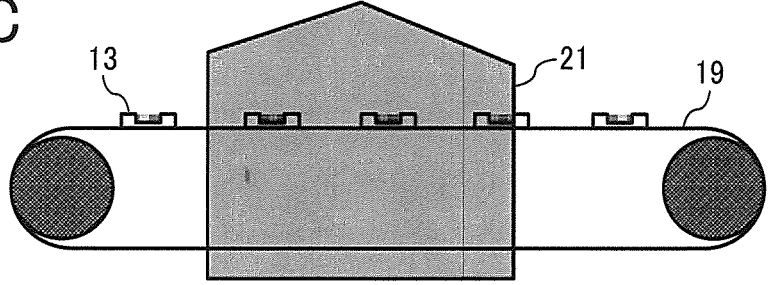

As yet another alternative of the batch production firing system of FIG. 4A, FIG. 4C specifically illustrates an exemplary light pulse exposure electrical insulation substrate production system that employs a pulse exposure firing kiln 21. As shown there, the light pulse exposure firing kiln 21 is again disposed along the path of the belt conveyor 19 to fire the molded articles of the heat-curable resin (i.e., the varnish 5) conveyed by the belt conveyor 19. For this purpose, the light pulse exposure firing kiln 21 includes a light pulse exposing device therein. Hence, as similar to the above-described continuous electrical insulation substrate production system, the varnishes 5 as the molded articles coated onto either the inner wall of the molds 13 or the metal plates 16 are heated by a light pulse and thereby fired when either the mold 13 or the metal plate 16 bearing the varnishes 5 thereon is conveyed by the belt conveyor 19 while passing through the light pulse exposure firing kiln 21. Since the varnish 5 coated onto either the inner wall of the mold 13 or the metal plate 16 is directly heated by the light pulse, temperature in the light pulse exposure firing kiln 21 does not need to be highly maintained, efficiency of heating the electrical insulation substrate 10 is greater than that of the above-described sequential production firing system. Again, as in the sequential production firing system that employs the sequential production firing kiln 23, since the firing operation is continuously executed, efficiency of producing the electrical insulation substrates 10 can be improved more than in the batch production firing system that employs the batch production firing kiln 18.

Figure 4D:
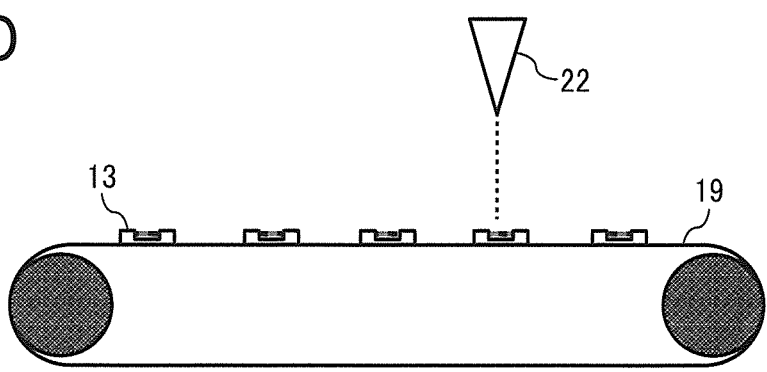

As yet another alternative of the batch production firing system, FIG. 4D schematically illustrates an exemplary laser light firing system. That is, as shown there, the belt conveyor 19 is again provided to convey either the molds 13 or the metal plates 16 with the varnishes 5 thereon. A laser 22 is provided along the path of the belt conveyor 19 to timely emit a laser light beam and heat the varnishes 5 coated onto either the inner wall of the molds 13 or the metal plates 16. Hence, as similar to the above-described sequential production firing system, the varnishes 5 coated onto either the inner wall of the molds 13 or the metal plates 16 are heated and fired one after another by the laser light beam when either the molds 13 or the metal plates 16 with the varnishes 5 thereon are sequentially conveyed by the belt conveyor 19. Since the varnish 5 coated onto either the inner wall of the mold 13 or the metal plate 16 is directly heated as well as either the mold 13 or the metal plate 16 by the laser light beam, efficiency of heating the electrical insulation substrate 10 is greater than that in the above-described light pulse exposure production system. Again, since the firing operation is continuously executed, efficiency of producing the electrical insulation substrates 10 can be improved as in the above-described sequential production firing system and the light pulse exposure production system as well.

Figure 5:
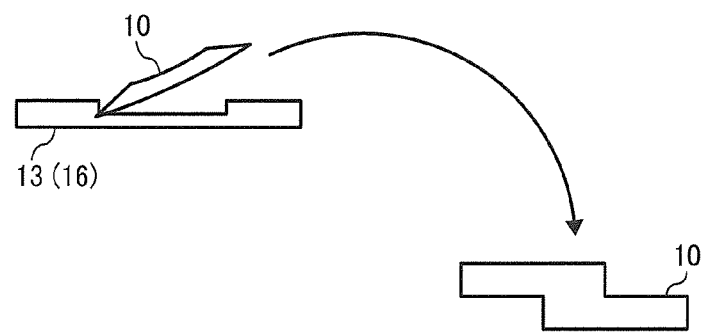
FIG. 5 is a diagram schematically illustrating an exemplary aspect of the heat-curable resin fired by using one of the exemplary methods shown in FIGS. 4B, 4C, and 4D is detached from either the mold or the metal plate according to one embodiment of the present invention.

The varnishes 5 fired by using one of the above-described electrical insulation substrate production systems is then peeled off from either the molds 13 or the metal plates 16, respectively, to obtain the electrical insulation substrates 10 as shown in FIG. 5. That is, FIG. 5 illustrates an exemplary aspect of the heat-curable resin when it is fired and is then detached from either the mold 13 or the metal plate 16.

Although the multiple steps of coating, firing, and peeling off the electrical insulation substrate 10 are executed to produce the electrical insulation substrate 10 as described heretofore, the present disclosure is not limited thereto, and may include the other steps as well.

For example, the heat-curable resin can be fed from a roll film, and is cut into a desired external shape (i.e., a shape of the electrical insulation substrates 10) by a laser light beam or the like in the substrate production step. In such a situation, when a film thickness of the role film, which is generally uniform, is to be partially changed, the ink-jet printing machine 15 is again employed as described with reference to FIG. 3C to eject the heat-curable resin onto a prescribed portion of the role film as needed. That is, the ink-jet printing machine 15 selectively writes a pattern onto the role film with the heat-curable resin. The role film (i.e., the heat-curable resin serving as the electrical insulation substrate 10) is then ultimately fired. In such a situation, the electrically conductive pattern 20 and the cover lay 40 are accordingly produced on a surface in which the above-described heat-curable resin is not printed by the ink-jet printing machine 15 opposite a surface in which the above-described heat-curable resin is printed by the ink-jet printing machine 15 (i.e., the ink-jet printing machine 15 selectively writes the pattern).

To the electrical insulation substrate 10 produced by the above-described electrical insulation substrate production process, a process of drilling a hole or the like can be applied as needed as well. The hole drilling process can be performed, for example, by using an NC (Numeral Control) machine or the like.

Now, the above-described second step of producing the flexible printed circuit board is herein below described in greater detail. That is, as briefly described earlier with reference to FIG. 2B, after the first step as shown in FIG. 2A is completed, the process of producing the electrically conductive pattern is executed as the second step. The process of producing the electrically conductive pattern is a process to form the electrically conductive pattern 20 on the electrical insulation substrate 10 produced by the above-described one of processes of producing the electrical insulation substrate 10. Specifically, the ink-jet printing machine 11 initially prints a pattern in a desired shape on the electrical insulation substrate 10 by ejecting conductive ink therefrom onto the electrical insulation substrate 10. The electrical insulation substrate 10 with the pattern printed with the conductive ink thereon is then fired, thereby forming (i.e., consolidating) the electrically conductive pattern 20 thereon. Again, various methods of firing the conductive ink ejected as the printing pattern on the electrical insulation substrate 10 can be employed as described earlier with reference to FIGS. 4A, 4B, 4C, and 4D. Then, one or more elements 30 (i.e., 30a, 30b, and 30c) can be mounted on the flexible printed circuit board 100 immediately after the electrically conductive pattern 20 is formed by executing the process of forming the electrically conductive pattern.

Now, the above-described third step is herein below described in greater detail with reference applicable drawings. As briefly described earlier with reference to FIG. 2C, after the second step as shown in FIG. 2B is completed, the process of producing the cover lay 40 on the electrical insulation substrate 10 is executed as the third step as described herein below in greater detail. That is, the cover lay 40 is produced on the electrical insulation substrate 10, on which the electrically conductive pattern 20 has already been formed in the electrically conductive pattern forming process. Specifically, first of all, the ink-jet printing machine 12 prints a pattern in a desired shape on the electrical insulation substrate 10 using the heat-curable resin of polyimide and liquid crystal polymer or the like as used in producing the electrical insulation substrate 10. Here, by changing a number of printing times, and accordingly an amount of heat-curable resin to be ejected, the cover lay 40 can have the different film thickness depending on the region thereof.

In such a situation, neighboring portions of the cover lay 40 having different film thicknesses from each other can be connected to each other via a slant as shown in FIG. 1 (i.e., portions thereof located at upper left and right above the elements 30b and 30c). The slant may be formed again, for example, by gradually changing a printing condition of the ink-jet printing machine 12 between neighboring portions of the cover lay 40 having different film thicknesses, respectively.

Subsequently, the electrical insulation substrate 10 with the cover lay 40 made of heat-curable resin printed thereon is consolidated, thereby completing the production process of the cover lay 40 thereon. Again, as described with reference to the FIGS. 4A, 4B, 4C, and 4D, various methods can be applied to fire the electrical insulation substrate 10 with the heat-curable resin of the cover lay 40 ejected thereon as the printing pattern.

Further, various processes such as inspecting an electrical conduction, attaching a reinforcement plate, and inspecting an appearance of the electrical insulation substrate 10, etc., can be optionally added to the above-described processes as needed as well.

In any situation, by implementing the above-described various steps, the flexible printed circuit board 100 can include the different film thickness depending on the region thereof.

Hence, as described heretofore, according to one aspect of the present invention, the flexible printed circuit board consistently having electrical insulation, heat resistance, and flexibility at the same time can be effectively prepared without employing steps of producing the roll film to serve as the electrical insulation substrate and laminating the cover lay onto the electrical insulation substrate. That is, according to one aspect of the present invention, the flexible printed circuit board includes a thin film electrical insulation substrate made of heat-curable resin having heat resistance and electrical insulation properties, an electrically conductive pattern composed of an electric conductor formed on the thin film electrical insulation substrate in a prescribed shape, and a thin film cover lay made of heat-curable resin placed and cured on the thin film electrical insulation substrate to cover the electrically conductive pattern. Each of the thin film electrical insulation substrate and the thin film cover lay of the flexible printed circuit board includes the different film thickness depending on the region thereof.

According to another aspect of the present invention, the flexible printed circuit board consistently having electrical insulation, heat resistance, and flexibility at the same time can be more effectively prepared without employing steps of producing the roll film to serve as the electrical insulation substrate and laminating the cover lay onto the electrical insulation substrate. That is, according to another aspect of the present invention, portions of the cover lay directly contact the electrical insulation substrate and the electrically conductive pattern, respectively.

According to yet another aspect of the present invention, the flexible printed circuit board consistently having electrical insulation, heat resistance, and flexibility at the same time can be more effectively prepared without employing steps of producing the roll film to serve as the electrical insulation substrate and laminating the cover lay onto the electrical insulation substrate. That is, according to yet another aspect of the present invention, a film thickness of one of the electrical insulation substrate and the cover lay varies depending on a region thereof.

According to yet another aspect of the present invention, the flexible printed circuit board consistently having electrical insulation, heat resistance, and flexibility at the same time can be more effectively prepared without employing steps of producing the roll film to serve as the electrical insulation substrate and laminating the cover lay onto the electrical insulation substrate. That is, according to yet another aspect of the present invention, portions of different thicknesses of one of the thin film electrical insulation substrate and the thin film cover lay are connected to each other by a slant.

According to yet another aspect of the present invention, the flexible printed circuit board consistently having electrical insulation, heat resistance, and flexibility at the same time can be more effectively prepared without employing steps of producing the roll film to serve as the electrical insulation substrate and laminating the cover lay onto the electrical insulation substrate. That is, according to yet another aspect of the present invention, a method of producing a flexible printed circuit board includes the steps of: producing an thin film electrical insulation substrate in a given shape with heat-curable resin having heat resistance and electrical insulation properties in an thin film electrical insulation substrate production step; forming an electrically conductive pattern with an electric conductor on the thin film electrical insulation substrate in a prescribed shape in an electrically conductive pattern forming step; and placing and curing a thin film cover lay made of heat-curable resin on the thin film electrical insulation substrate while almost covering the electrically conductive pattern in a thin film cover lay placing and curing step.

According to yet another aspect of the present invention, the flexible printed circuit board consistently having electrical insulation, heat resistance, and flexibility at the same time can be more effectively prepared without employing steps of producing the roll film to serve as the electrical insulation substrate and laminating the cover lay onto the electrical insulation substrate. That is, according to yet another aspect of the present invention, the step of producing the electrical insulation substrate includes the sub-steps of: coating the heat-curable resin in a varnish state onto an inner wall of the mold having a shape corresponding to the given shape of the electrical insulation substrate in a coating sub-step; heating and curing the heat-curable resin coated onto the inner wall of the mold in a firing sub-step; and peeling off the heat-curable resin after the heat-curable resin is cured in the firing process from the mold in a peeling off step.

Numerous additional modifications and variations of the present invention are possible in light of the above teachings. It is therefore to be understood that within the scope of the appended claims, the present invention may be executed otherwise than as specifically described herein. For example, the flexible printed circuit board is not limited to the above-described various embodiments and modifications may be altered as appropriate. Further, the method of producing a flexible printed circuit board is not limited to the above-described various embodiments and modifications may be altered again as appropriate. For example, a step of the method of producing the flexible printed circuit board can be altered as appropriate.

What is claimed is:

1. A flexible printed circuit board comprising:
a thin film electrical insulation substrate made of heat-curable resin having heat resistance and electrical insulation properties;
an electrically conductive pattern composed of an electric conductor formed on the thin film electrical insulation substrate in a prescribed shape; and
a thin film cover lay made of heat-curable resin placed and cured on the thin film electrical insulation substrate to cover the electrically conductive pattern, and
wherein a thickness of the thin film electrical insulation substrate varies depending on a region of the electrical insulation substrate, and said thickness includes at least three types of thickness.

2. The flexible printed circuit board according to claim 1, wherein the thin film electrical insulation substrate is molded in a shape of either a letter S or a letter L.

3. The flexible printed circuit board according to claim 1, wherein the electrically conductive pattern is printed in a prescribed shape,
wherein the electrically conductive pattern electrically connects various types of electronic components mounted on the flexible printed circuit board with external parts located outside the flexible printed circuit board.

4. The flexible printed circuit board according to claim 3, wherein the thin film cover lay is printed in a prescribed shape to cover the various types of electronic components mounted on the flexible printed circuit board.

5. The flexible printed circuit board according to claim 1, wherein portions of the thin film cover lay directly contact the thin film electrical insulation substrate and the electrically conductive pattern, respectively.

6. The flexible printed circuit board according to claim 5, wherein the portions of the thin film cover lay directly contact the thin film electrical insulation substrate and the electrically conductive pattern, respectively, in a state in which the thin film cover lay is fired together with the thin film electrical insulation substrate bearing the electrically conductive pattern formed thereon.

7. The flexible printed circuit board according to claim 1, wherein a thickness of the thin film cover lay varies depending on a region of the thin film cover lay.

8. The flexible printed circuit board according to claim 7, wherein each of the thin film electrical insulation substrate and the thin film cover lay is printed by a printing machine that emits a heat-curable resin,
wherein the thickness of each of the thin film electrical insulation substrate and the thin film cover lay is changed by changing a total amount of the heat-curable resin emitted from the printing machine depending on the region of each of the thin film electrical insulation substrate and the thin film cover lay.

9. The flexible printed circuit board according to claim 8, wherein the total amount of the heat-curable resin emitted from the printing machine is changed depending on the region of each of the thin film electrical insulation substrate and the thin film cover lay by changing the number of emitting times of the heat-curable resin from the printing machine onto the region of each of the thin film electrical insulation substrate and the thin film cover lay.

10. The flexible printed circuit board according to claim 7,
wherein portions of different thicknesses of one of the thin film electrical insulation substrate and the thin film cover lay are connected by a slant.

11. The flexible printed circuit board according to claim 10,
wherein the thin film electrical insulation substrate is a molded article molded by a mold having a slant at a portion of the mold corresponding to the slant.

12. The flexible printed circuit board according to claim 10,
wherein the thin film cover lay is a printing made by a printing machine, and the slant is formed by gradually changing a printing condition of the printing machine at a portion of the thin film cover lay corresponding to the slant.

13. The flexible printed circuit board according to claim 1,
wherein the thin film electrical insulation substrate is molded by a mold having a prescribed shape to change the thickness of the thin film electrical insulation substrate depending on the region thereof.

* * * * *